United States Patent [19]
Nanami et al.

[11] Patent Number: 5,796,643
[45] Date of Patent: Aug. 18, 1998

[54] LOGICAL OPERATOR BASED DIGITAL FILTER

[75] Inventors: Tomoyuki Nanami, Obu; Satoshi Yamashita, Kuwana, both of Japan; Dennis M. Wright, Eastlake; Kendal R. Harris, Mentor, both of Ohio

[73] Assignee: Allen-Bradley Company, LLC, Milwaukee, Wis.

[21] Appl. No.: 582,002

[22] Filed: Jan. 2, 1996

[51] Int. Cl.$^6$ .............................. G06F 17/10; G06F 7/38
[52] U.S. Cl. ..................... 364/724.011; 364/724.013; 364/716.02
[58] Field of Search ................ 364/724.013, 724.011, 364/716.02, 736.01

[56] References Cited

U.S. PATENT DOCUMENTS

| | | |
|---|---|---|
| 3,909,789 | 9/1975 | Holtey et al. ............... 364/716.02 |
| 4,037,094 | 7/1977 | Vandierendonck ........... 364/716.02 |
| 4,503,511 | 3/1985 | Vandierendonck ........... 364/716.02 |
| 4,785,393 | 11/1988 | Chu et al. ..................... 364/716.02 |

*Primary Examiner*—Tan V. Mai
*Attorney, Agent, or Firm*—William R. Walbrun; John M. Miller; John J. Horn

[57] ABSTRACT

A digital filter with a reduced filtering time. On/off data provided by eight contacts are read at predetermined time intervals, and the on/off data are stored in 8-bit binary data. (four-to one-cycle-previous data and new data). Logical AND and logical OR between the data are carried out to obtain AND result X and OR result Z, logical operations between the previous result In-1 and AND result X is carried out to obtain a result Y, and logical AND between the result Y and the OR result Z is carried out. A bit "A" whose AND result X is "1" is set again to "1", and a bit B whose OR result Z is "0" is set again to "0".

4 Claims, 6 Drawing Sheets

| PRECEDING RESULT (IN-1) | 0 | 1 | 0 | 0 | 1 | 1 | 1 | 0 |
|---|---|---|---|---|---|---|---|---|
| FOUR-CYCLE-PREVIOUS DATA | 1 | 0 | 1 | 1 | 1 | 1 | 1 | 1 |
| THREE-CYCLE-PREVIOUS DATA | 1 | 0 | 1 | 1 | 1 | 1 | 1 | 1 |
| TWO-CYCLE-PREVIOUS DATA | 1 | 0 | 0 | 0 | 0 | 0 | 0 | 0 |
| ONE-CYCLE-PREVIOUS DATA | 1 | 0 | 0 | 0 | 0 | 0 | 0 | 0 |
| NEW DATA | 1 | 0 | 0 | 1 | 1 | 1 | 1 | 0 |
| AND RESULT (X) | 1 | 0 | 0 | 0 | 0 | 0 | 0 | 0 |

| PRECEDING RESULT (IN-1) | 0 | 1 | 0 | 0 | 1 | 1 | 1 | 0 |
|---|---|---|---|---|---|---|---|---|
| FOUR-CYCLE-PREVIOUS DATA | 1 | 0 | 1 | 1 | 1 | 1 | 1 | 1 |
| THREE-CYCLE-PREVIOUS DATA | 1 | 0 | 1 | 1 | 1 | 1 | 1 | 1 |
| TWO-CYCLE-PREVIOUS DATA | 1 | 0 | 0 | 0 | 0 | 0 | 0 | 0 |
| ONE-CYCLE-PREVIOUS DATA | 1 | 0 | 0 | 0 | 0 | 0 | 0 | 0 |
| NEW DATA | 1 | 0 | 0 | 1 | 1 | 1 | 1 | 0 |
| OR RESULT (Z) | 1 | 0 | 1 | 1 | 1 | 1 | 1 | 1 |

| | | | | | | | | |
|---|---|---|---|---|---|---|---|---|
| PRECEDING RESULT (IN-1) | 0 | 1 | 0 | 0 | 1 | 1 | 1 | 0 |
| FOUR-CYCLE-PREVIOUS DATA | 1 | 0 | 1 | 1 | 1 | 1 | 1 | 1 |
| THREE-CYCLE-PREVIOUS DATA | 1 | 0 | 1 | 1 | 1 | 1 | 1 | 1 |
| TWO-CYCLE-PREVIOUS DATA | 1 | 0 | 0 | 0 | 0 | 0 | 0 | 0 |
| ONE-CYCLE-PREVIOUS DATA | 1 | 0 | 0 | 0 | 0 | 0 | 0 | 0 |
| NEW DATA | 1 | 0 | 0 | 1 | 1 | 1 | 1 | 0 |
| AND RESULT (X) | 1 | 0 | 0 | 0 | 0 | 0 | 0 | 0 |
| RESULT Y OF LOGICAL OR BETWEEN X AND IN | 1 | 1 | 0 | 0 | 1 | 1 | 1 | 0 |
| OR RESULT (Z) | 1 | 0 | 1 | 1 | 1 | 1 | 1 | 1 |
| RESULT IN OF LOGICAL AND BETWEEN Y AND Z | 1 | 0 | 0 | 0 | 1 | 1 | 1 | 0 |
| | ↑ | ↑ | ↑ | ↑ | ↑ | ↑ | ↑ | ↑ |
| | A | B | C | C | C | C | C | C |

FIG. 8

LOGICAL OPERATOR BASED DIGITAL FILTER

FIELD OF INVENTION

The present invention relates to a digital filter for filtering noise from input digital data.

BACKGROUND OF THE INVENTION

When binarizing an input signal provided by a contact type signal source, such as a limit switch or a toggle switch, and giving a binary signal obtained by binarizing the input signal to a computer or the like, chattering occurs when the contact of the contact type signal source is inverted such that the signal source is turned on and off repeatedly due to minute vibrations of the contact of the contact type signal source. If signals provided by chattering are binarized directly and logical operations are executed on the basis of data obtained by binarizing the signals provided by chattering, the computer or the like may malfunction.

A digital filter for filtering noise from digital data is proposed in, for example, Japanese Patent Laid-Open No. 59-220805. This prior art digital filter reads digital data at a predetermined period, counts the number of successive repetitions of data of "1" by is a counter, and provides data of "1" when the number of successive repetitions reaches the predetermined number. Consequently, the output data of "1" is not provided when if the input data of "1" is given momentarily, so that noise can be filtered out. The digital filter of this type, as compared with an analog filter employing an integrating circuit, has a simple circuit configuration. However, the process of counting the number of successive repetitions of "1" by the counter requires a comparatively long time, and hence this prior art digital filter requires a comparatively long time for filtering the data. Therefore, there is a limit to the improvement of the input data follow-up capability of the aforementioned prior art digital filter. Accordingly, there is a present need for a digital filter capable of accomplishing a filtering operation in a reduced time.

SUMMARY OF THE INVENTION

Figure 8:
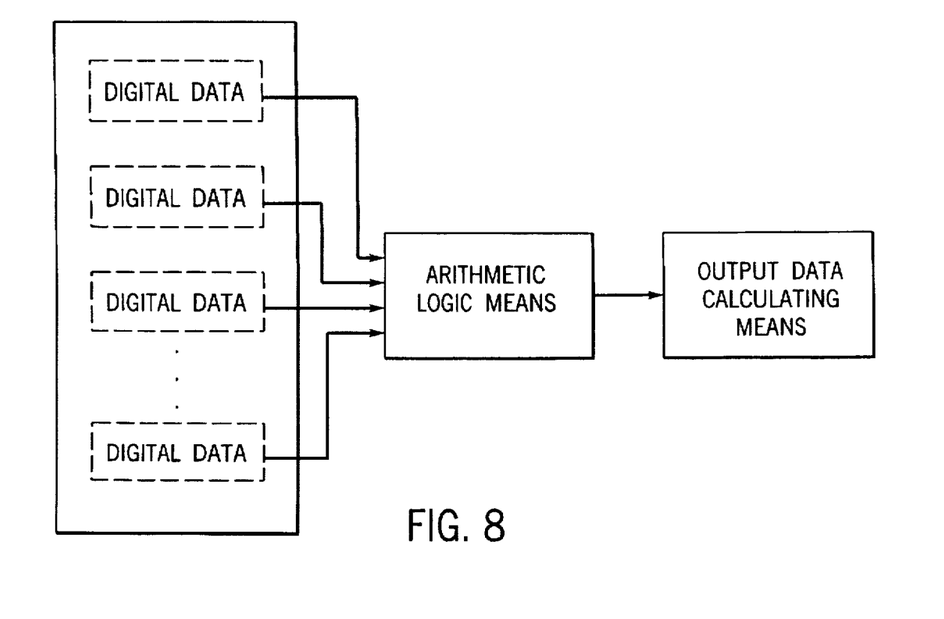
FIG. 8 is a view of the configuration of an invention stated in claim 1.

A digital filter according to the present invention accomplishes filtering in a reduced time. As shown in FIG. 8, the filter comprises an input data storage means for individually storing digital data sequentially read in a plurality of read cycles, an arithmetic logic means that carries out logical OR or logical AND between the digital data stored in the input data storage means, and an output data calculating means that calculates output data according to the results of operation of the arithmetic logic means. It is another object of the present invention to provide a digital filter wherein, the arithmetic logic means carries out logical OR and logical AND between the digital data, and the output data calculating means sets the output data variable to "1" when the variable of logical AND is "1", sets the output data variable to "0" when the variable of logical AND is "0", and does not change the output data under other conditions.

it is another object of the present invention to provide a digital filter wherein the digital data are those of a plurality of digits, and the arithmetic logic means and the output data calculating means carries out said operations simultaneously for each digit.

In accordance with the present invention input data storage means stores individual digital data sequentially from a plurality of read cycles, the arithmetic logic means carries out logical OR or logical AND between the digital data stored in the input data storage means, and the output data calculating means operates the output data obtained by the operation of the arithmetic logic means. The variable of logic AND is "1" only when all the variables of the data are "1", and the variable of logic OR is "0" only when all the variables of the data are "0". Therefore, the results of operation of the arithmetic logic means reflects satisfactorily whether the variables of the input data are successively "1" or "0". The output data calculating means provides digital data without of noise or the like as output data by making reference to the output of the arithmetic logic means.

As is generally known, processes of carrying out logical OR and logical AND can be very quickly executed as compared with processes for counting up or counting down by a counter. Accordingly, the present invention utilizes this knowledge to reduce the time necessary for carrying out the aforesaid operations, i.e., operations for filtering data, such that input data follow-up characteristics can be improved.

In accordance with one object of this invention, the arithmetic logic means carries out logic OR and logic AND between digital data, the output data calculating means sets the variable of the output data to "1" when the variable of logical AND is "1", sets the variable of the output data to "0" when the variable of logical AND is "0", and does not change the output data under other conditions. Thus, the output data variable is set to "1" when the input variable of logic AND indicates that all the variables of the digital data stored in the input data storage means are "1", the output data variable is set to "0" when the input variable of logic OR indicates that all the variables of the digital data is "0", and the values of the output data are not changed under other conditions. When the output data variables are set to "1", the variables of the successively read digital data are held at "1", which is practiced by the prior art digital filter, and the output data variable changes to "0" instantly when one data of a variable of "0" is read. On the contrary, when the variable of the output data is set to "0" the variables of the successively read digital data are held at "0" and the variable of the output data changes to "1" instantly when one data of a variable of "1" is read. According to the present invention, a process of changing the output data variable from "1" to "0" and a process of changing the same from "0" to "1" are executed when the variables of the digital data read in the predetermine read cycles corresponding to the capacity of the input data storage means are held. Therefore, the present invention is capable of avoiding the variation of the output data due to noise or the like. Thus, the noise filtering effect is available in addition to the effect of the invention stated in claim 1.

In accordance with yet another object of this invention, the digital data are those of a plurality of digits and the arithmetic logic means and the output data calculating means carries out said operations simultaneously for each digit. A process of simultaneously carrying out logical OR or logical AND between the digits of the digital data of the plurality of digits is well known and, as is generally known, such a process can be executed very quickly as compared with processes for counting up or counting down by a counter. In the present invention, the digits of the digital data of a plurality of digits can be simultaneously processed as independent digital data. In contrast, the process for counting up or counting down by a counter must be executed for each digital data. Therefore, the time necessary for filtering increases with the number of independent digital data. Accordingly, the invention has an effect of simultaneously processing a plurality of independent digital data without increasing the time necessary for filtering. Thus, the further reduction of the time necessary for filtering digital data further improves the input data follow-up characteristics.

DETAILED DESCRIPTION OF THE PREFERRED EMBODIMENT

Figure 1:
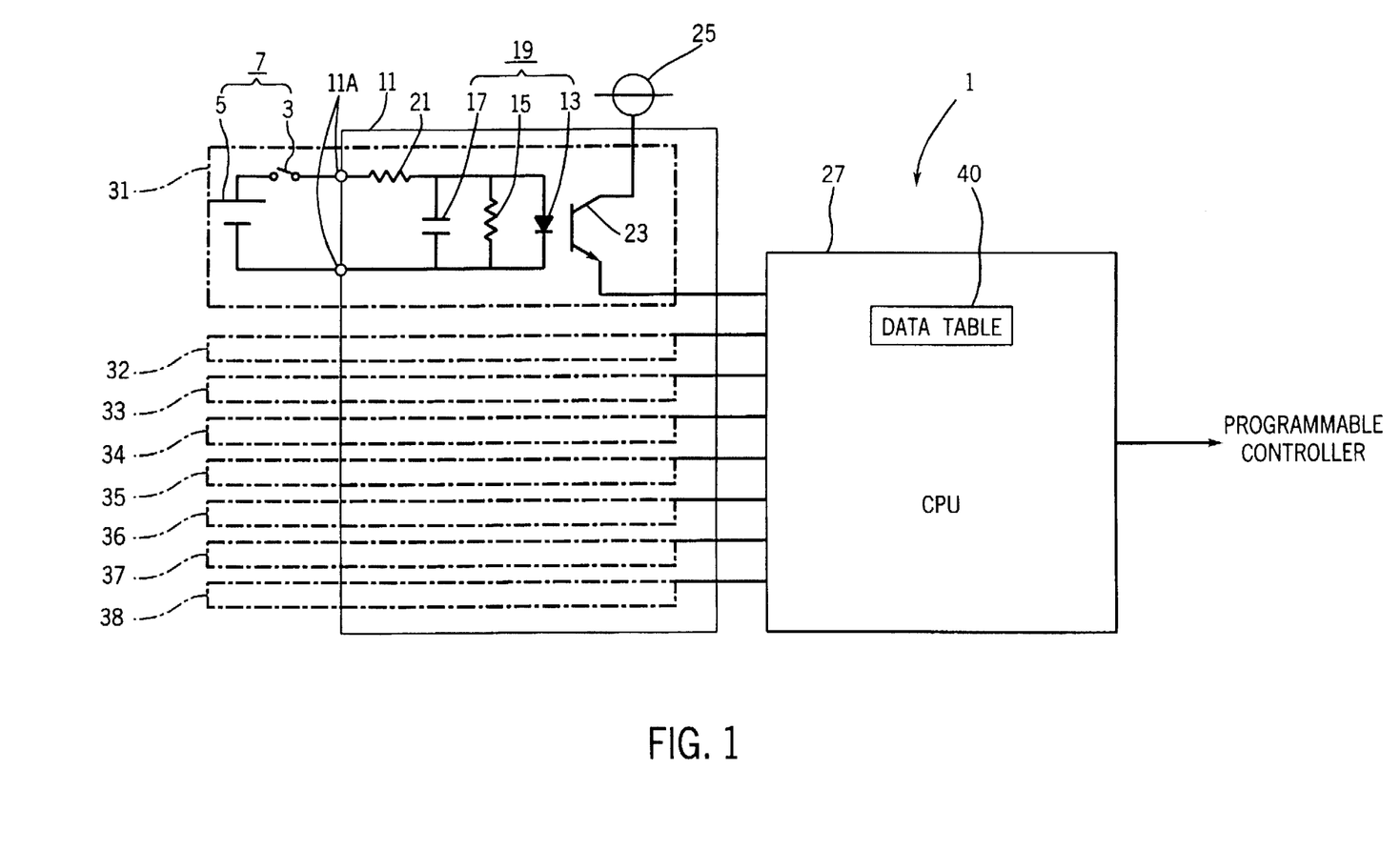
FIG. 1 is a block diagram of an input module in a preferred embodiment according to the present invention.

Preferred embodiments of the present invention will be described hereinafter with reference to the accompanying drawings. FIG. 1 shows an 8-point input module 1 that filters input signals provided by eight contacts 3 (only one of the eight contacts is shown in FIG. 1) and gives output signals obtained by filtering the input signals to a programmable computer, not shown. A series circuit 7 comprising a contact 3, such as a limit switch or a toggle switch, and a dc power supply 5 has opposite ends which are connected through a pair of terminals 11a connected to a binarizing unit 11 having a parallel circuit 19 comprising a light emitting diode 13, a resistor 15 and a capacitor 17. One of the pair of terminals 11a is connected through a resistor 21 to one end of the parallel circuit 19, and the other terminal 11a is connected directly to the other end of the parallel circuit 19. A phototransistor 23 is disposed opposite to the light emitting diode 13. The phototransistor 23 has a collector connected to a 5-volt signal power supply 25, and an emitter connected to a CPU 27.

When the contact 3 is closed, the light emitting diode 13 emits light, and the voltage of the signal power supply 25 is applied to the CPU 27. The capacitor 17 filters out the high-frequency components of noise generated when the contact 3 is inverted, and the resistors 15 and 21 adjust the current that flows through the light emitting diode 13. Therefore, a digital signal of 5 V or 0 V are given to the CPU 27 when the contact 3 is turned on or turned off, respectively.

The binarizing unit 11 comprises eight circuits similar to the circuit including the light emitting diode 13 and the phototransistor 23. The same series circuits 7 as the aforesaid series circuit 7 are connected to the eight circuits, respectively, to form digital signal generators 31 to 38. The CPU 27 is provided with a data table 40, which will be described later, which processes digital signals provided by the digital signal generators 31 to 38 to filter out noise, and gives filtered digital signals to a programmable controller. Thereafter, the programmable controller drives an actuator, such as a solenoid valve or a motor according to the data given thereto.

Figure 2:
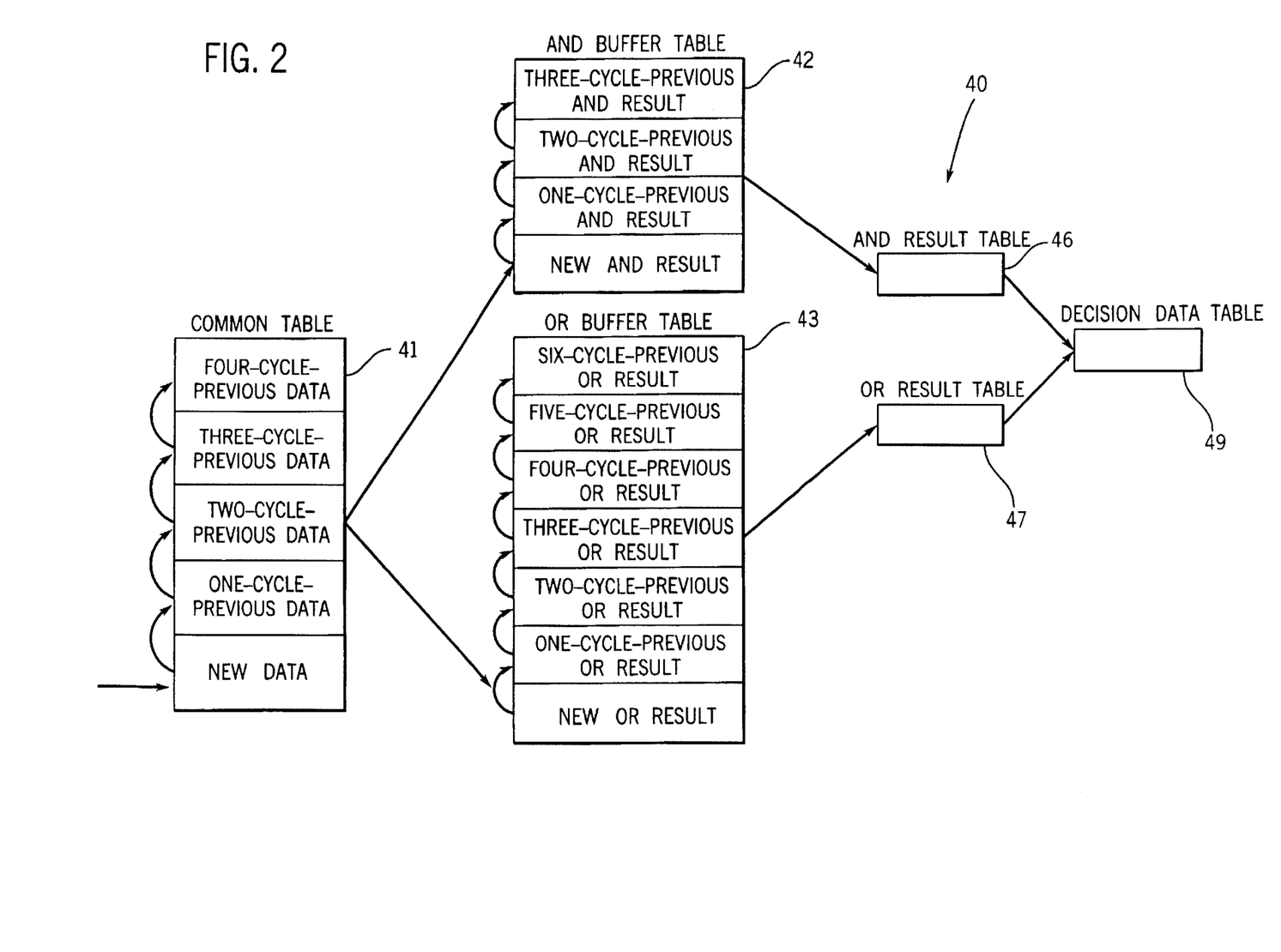
FIG. 2 is a diagrammatic view of assistance in explaining the constitution of a data table included the input module of FIG. 1 in accordance with the present invention.

FIG. 2 is a diagram of assistance in explaining the data table 40. The data table 40 comprises a common table 41 for storing 8-bit data corresponding to the digital signals sequentially read from the digital signal generators 31 to 38, an AND buffer table 42 for storing the results of logical AND between the digital data stored in the common table 41, an OR buffer table 43 for storing the results of logical OR between the digital data stored in the common table 41, an AND result table 46 for storing the results of logical AND between the plurality of results of logical AND stored in the AND buffer table 42, an OR result table 47 for storing the results of logical OR between the plurality of results of logical OR stored in the OR buffer table 43, and a decision data table 49 for storing output data to be given to the programmable controller, calculated on the basis of the digital data stored in the AND result table 46 and the OR result table 47.

The common table 41, i.e., input data storage means, has five addresses capable of storing 8-bit digital data. The AND buffer table 42 has addresses capable of storing 8-bit digital data. The number of the addresses of the AND buffer table 42 (four addresses in the example shown in FIG. 2) corresponds to an -ON time of each contact 3. The OR buffer table 43 has addresses capable of storing 8-bit digital data. The number of the addresses of the OR buffer table 43 (seven addresses in the example shown in FIG. 2) corresponds to an OFF time of each contact 3. The AND result table 46 and the OR result table 47 have each one address capable of storing 8-bit digital data.

The ON time is the time necessary for deciding that the contact 3 is in the ON-state, and the OFF time is the time necessary for deciding that the contact 3 is in the OFF-state. For example, in the example shown in FIG. 2, a decision that the contact 3 is in the ON-state can be made when the signal from the contact 3 is held in the ON-state for a time expressed by:

5×4×(Data read period of CPU 27)

where 5 is the number of the addresses of the common table 41, and 4 is the number of the addresses of the AND buffer table 42. Similarly, a decision that the contact 3 is in the OFF-state can be made when the signal from the contact 3 is held in the OFF-state for a time expressed by:

5×7×(Data read period of CPU 27)

where 5 is the number of the addresses of the common table 41 and 7 is the number of the addresses of the OR buffer table 43. The respective numbers of the addresses of the AND buffer table 42 and the OR buffer table 43 (hereinafter referred to as an ON counter and an OR counter, respectively) can be set by operating switches, not shown.

Figure 3:
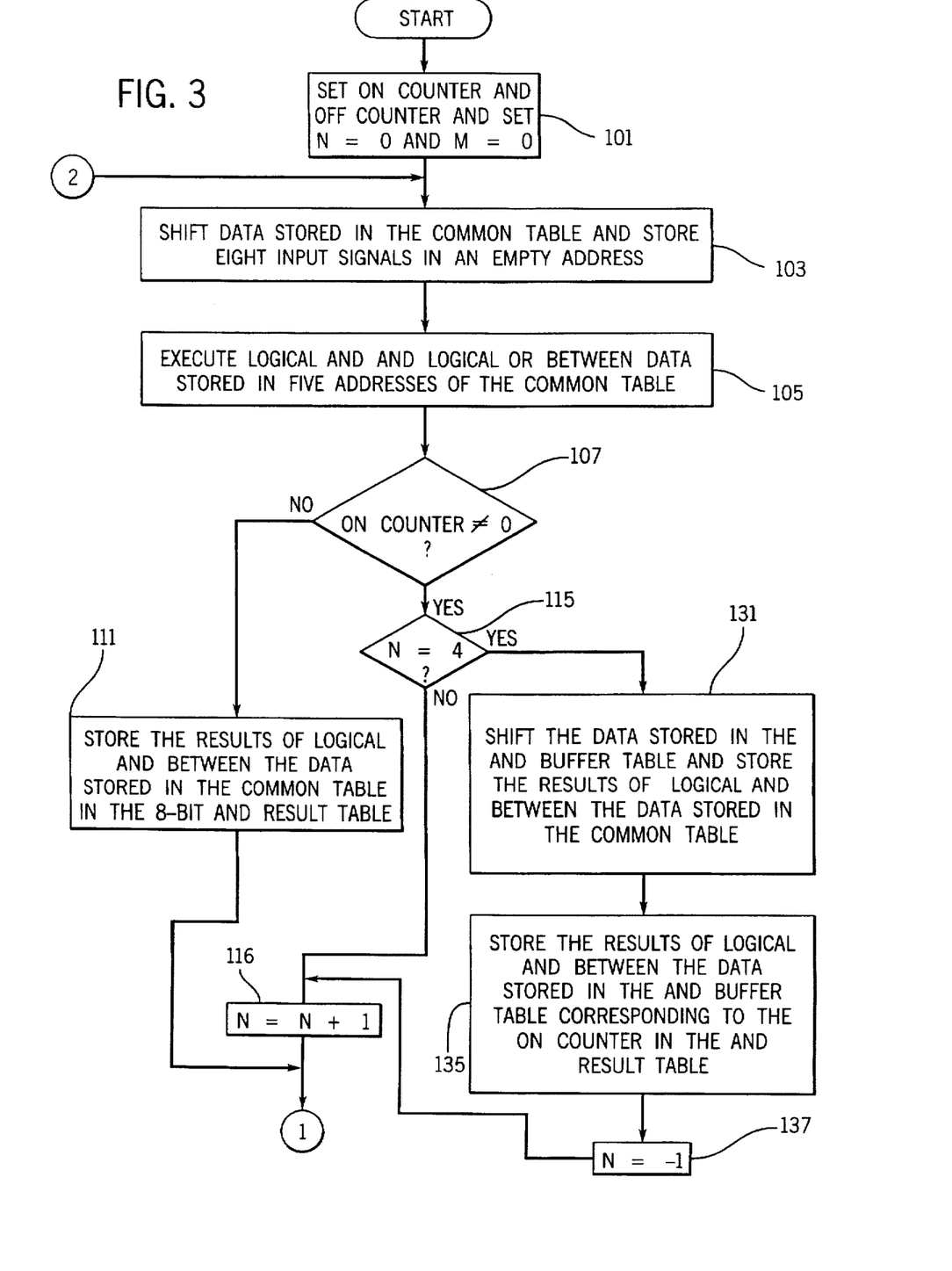
FIG. 3 is a flow chart of a filtering process to be carried out by the input module of FIG. 1 in accordance with the present invention.
Figure 4:
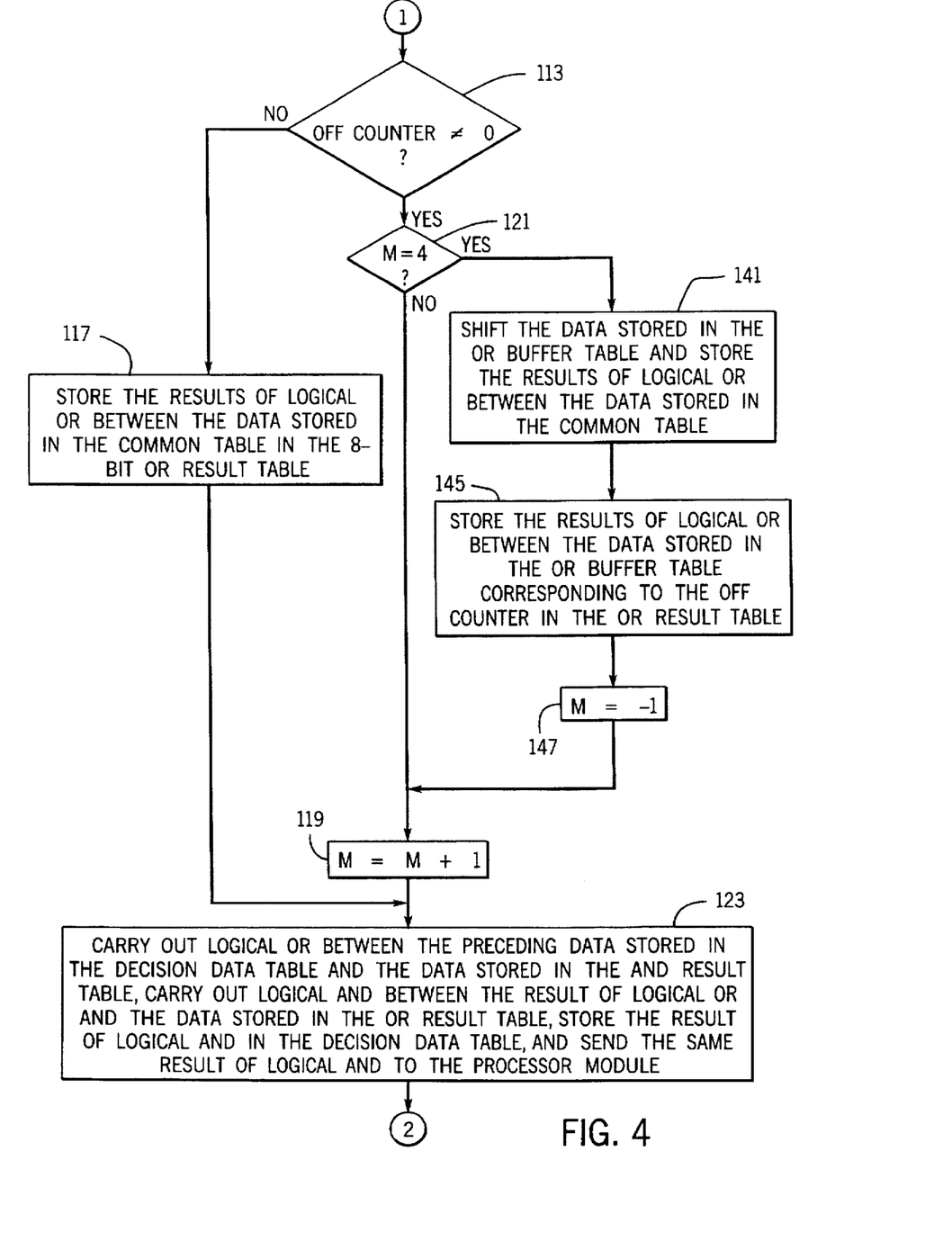
FIG. 4 is a flow chart of the filtering process to be carried out by the input module of FIG. 1 in accordance with the present invention.

A filtering process carried out by the CPU 27 is described with reference to flow charts shown in FIGS. 3 and 4. The filtering process is started when the CPU is connected to a power supply. In step 101, the CPU 27 sets the ON counter and the OFF counter to values specified by operating the switches, 4 and 7 in the example shown in FIG. 2, and sets counters m and n to 0. In step 103, the data stored in the addresses of the common table 41 are shifted up by one address and 8-bit digital data read from the binarizing unit 11 is entered into the empty lowermost address.

In step 105, the results of AND and OR between all the bits of the digital data stored in the addresses of the common table 41 are carried out simultaneously. In step 107, a query is made to see if the ON counter is not 0. When the ON counter is 0, the process goes through step 111 to step 113. When the ON counter is not 0, step 115 is executed.

In step 111, the results of logical AND between the data stored in the common table 41 are stored in the 8-bit AND result table 46; that is, the AND buffer table 42 does not virtually exist when the ON counter is 0. Therefore, the results of logical AND between the data stored in the common table 41 (step 105) carried out in each processing cycle are stored directly in the AND result table 46 to use the results as data for calculating data to be stored in the decision data table 49. In step 115, a query is made to see if the counter n is 4. When the response to the query in step 115 is negative, step 116 is executed.

In step 113, a query is made to see if the OFF counter is not 0. If the OFF counter is 0, the process goes through step 117 to step 123 and, if not, step 121 is executed. When the OFF counter is 0, the OR buffer table 43 does not virtually exist. Therefore, in step 117, the results of logical OR between the data stored in the common table 41 are stored in the 8-bit OR result table 47. In step 121, a query is made to see if the counter m is 4 and, if not, step 119 is executed.

The count of the counter m is incremented in step 119, and then the data stored in the decision data table 49 is updated in step 123. In step 123, logical OR between the data stored in the decision data table 49 in the preceding processing cycle and the data stored in the AND result table 46 is carried out, logical AND between the result of logical OR and the data stored in the OR result table 47 is carried out, and then the results of logical OR and logical AND are stored in the decision data table 49 and, at the same time, the results are sent to the processor module.

The process goes from step 123 to step 103, the count of the counter n is incremented every processing cycle and the processing cycle is repeated. Upon the increase of the count of the counter n to 4 with the ON counter not 0, i.e., when the responses in steps 107 and 115 are affirmative, step 131 and the following steps described below are executed.

In step 131, the data stored in the addresses of the AND buffer table 42 are shifted up by one and the results of logical AND obtained in step 105 is stored in the empty lowermost address. Then, in step 135, logical AND between the results of logical AND stored in the AND buffer table 42 is carried out, the number of the results being equal to the count of the ON counter, and the results of logical AND are stored in the 8-bit AND result table 46. In step 137, the counter n is set to 1 and then step 116 is executed. In step 116, n=0, and then steps 131 to 137 are executed after five processing cycles have been completed.

Figure 5:
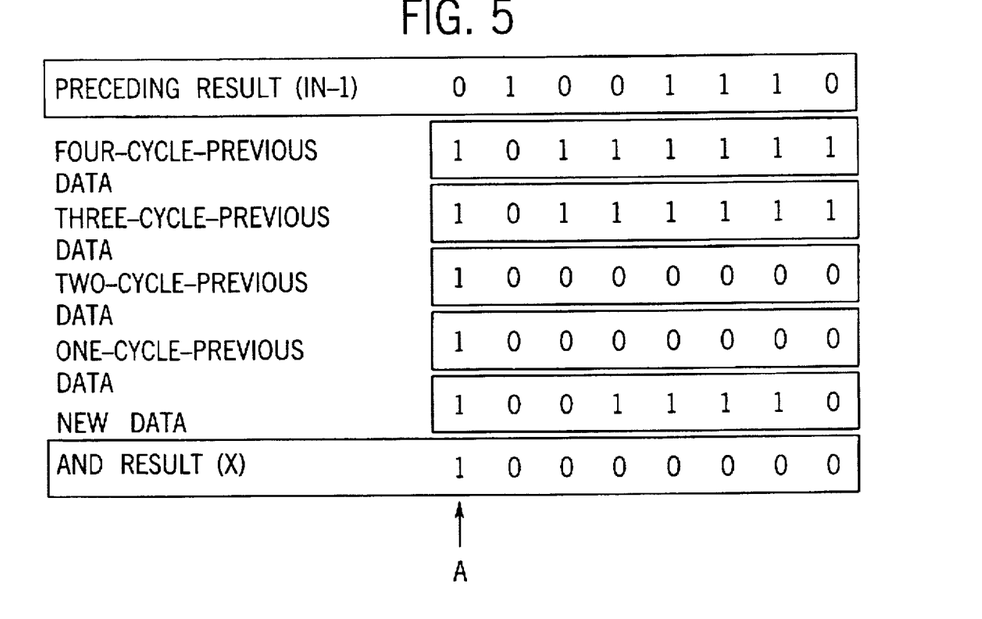
FIG. 5 is a diagrammatic view of assistance in explaining the flow of data stored in an AND result table included in the input module of FIG. 1 in accordance with the present invention.
Figure 6:
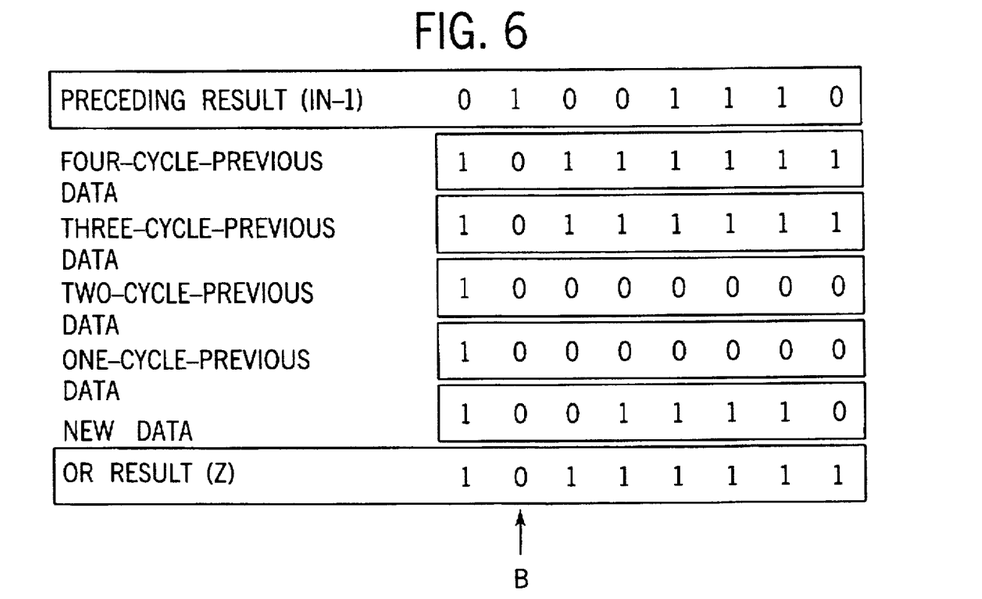
FIG. 6 is a diagrammatic view of assistance in explaining the flow of data stored in an OR result table included in the input module of FIG. 1 in accordance with the present invention.
Figure 7:
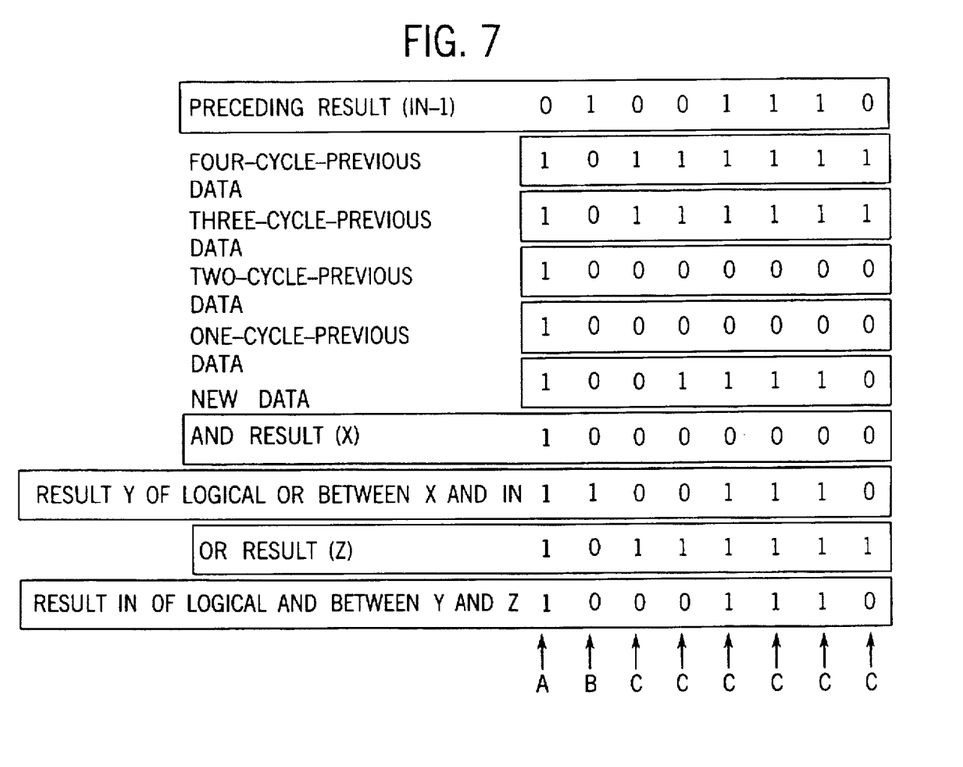
FIG. 7 is a diagrammatic view of assistance in explaining the flow of data stored in a decision data table included in the input module of FIG. 1 in accordance with the present invention.

Similarly, when the count of the OFF counter is not 0 and the count of the counter m reaches 4, i.e., when the responses in steps 113 and 121 are affirmative, the data stored in the OR buffer table 43 are shifted and the results of logical OR obtained in step 105 are stored in the empty address in step 141, logical OR between the results of logical OR stored in the OR buffer table 43 is carried out, the number of the results being equal to the count of the OFF counter, and the results of logical OR is stored in the OR resulttable 47 in step 145. Instep 147, the counter m is set to −1, and the step 119 and the following steps are executed. Then, m=0 in step 119 and steps 141 to 147 are executed after the completion of five processing cycles; that is, the data stored in the AND result table 46 or the OR result table 47 are updated every time all the data stored in the common table 41 have been changed by executing step 103 five times. The flow of data in the foregoing process will be described with reference to FIGS. 5 to 7. In FIGS. 5 to 7, it is assumed that the counts of the ON counter and the OFF counter are 0 for convenience sake. The data In−1 obtained by the preceding processing cycle and stored in the decision data table 49 (preceding result) is "0 1 0 0 1 1 1 0", data stored in the common table 41 are four-cycle-previous data "1 0 1 1 1 1 1 1", three-cycle-previous data "1 0 1 1 1 1 1 1", two-cycle-previous data "1 0 0 0 0 0 0 0", one-cycle-previous data "1 0 0 0 0 0 0 0" and new data "1 0 0 1 1 1 1 0".

As shown in FIG. 5, the AND result X of logical AND between the data stored in the common table 41 is "1 0 0 0 0 0 0 0" (step 105). The AND result X is stored in the AND result table 46 (step 111). The first bit A of the AND result X is "1", which indicates that the first bit of each of the five successive data is "1".

As shown in FIG. 6, the OR result Z of logical OR between the data stored in the common table 41 is "1 0 1 1 1 1 1 1" (step 105). The OR result Z is stored in the OR result table 47 (step 117). The second bit B of the OR result Z is "0", which indicates that the second bit of each of the five successive data is "0". The bit which has been successively "1" can be recognized by making reference to the AND result X stored in the AND result table 46, and the bit which has been successively "0" can be recognized by making reference to the OR result Z stored in the OR result table 47.

In step 123, processing result In is calculated by the following method described below. As shown in FIG. 7, logical OR between the preceding result In−1 stored in the decision data table 49 and the AND result X is carried out to obtain a result Y. Then, the bit A which has been "1" in the previous five successive processing cycles can be set again to "1". The values of other bits B and C are held at the preceding result In−1. Logical AND between the result Y and the OR result Z is carried out. Then, the bit B which has been "0" in the previous five successive processing cycles can be set again to "0". The third and the following bits C are held at the previous result In−1. Then, the data stored in the decision data table are substituted by this data (processing results In). Consequently, only the bit A which has been "1" in the previous five successive processing cycles and the bit B which has been "0" in the previous five successive processing cycles are set to "1" and "0", respectively, and thereby the variation of data to be sent to the programmable controller due to noise or the like can be effectively prevented.

When the ON counter and the OFF counter in FIG. 2 are set to 4 and 7, respectively, only the bit which has been "1" in the previous twenty (5×4) processing cycles can be set to "1", and only the bit which has been "0" in the previous thirty-five (5×7) processing cycles can be set to "0". The variation of the data due to noise or the like can be effectively prevented for the contact 3 in which the ON-time and the OFF-time are different.

As is apparent from the foregoing description, the input module 1 in this embodiment is capable of reducing noise simply by carrying out logical AND and logical OR between the input data. As is generally known, operations for logical AND and logical OR can be very quickly carried out as compared with the counting up and counting down operations of a counter. Therefore, this embodiment is capable of satisfactorily reducing the time necessary for carrying out the aforesaid process, namely, the time necessary for data filtering, which improves the input data follow-up characteristics. Specifically, this embodiment changes the variable of the bit to "1"or "0" only when the bit has been "1" or "0"

in the predetermined number of processing cycles corresponding to the ON counter or the OFF counter. Therefore, noise can be satisfactorily reduced both when the variable is "1" and when the variable is "0". Additionally, as discussed, this embodiment carries out logical AND and logical OR simultaneously between 8-bit digital data. Thus, the data provided by the eight contacts 3 can be simultaneously processed without increasing the time necessary for filtering. Consequently, the time necessary for filtering the digital data can be very satisfactorily reduced and thereby the input data follow-up characteristics can be improved. In this embodiment, steps 105 and 123 correspond to the arithmetic logic means and the output data calculating means, respectively. The present invention is not limited in its practical application to the foregoing embodiment specifically described herein, and may be embodied in various forms without departing from the scope of the invention. For example, in another embodiment, logic AND between the preceding result In−1 and the OR result Z, and logical OR between the results of the logical AND and the AND result X may be carried out in step 123. This embodiment, similarly to the embodiment described above, is capable of reducing noise or the like. Only the AND result X or the OR result Z may be given to the programmable controller. The present invention may be constructed to deal with data other than the 8-bit data, such as 1-bit data or 16-bit data.

We claim:

1. A digital filter comprising:

an input data storage means for individually storing digital data sequentially read in a plurality of read cycles;

an arithmetic logic means that carries out logical OR or logical AND on the digital data stored in the input data storage means; and an output data calculating means that calculates an output data according to the results of operation of the arithmetic logic means;

wherein the arithmetic logic means carries out logical OR and logical AND on the digital data, and the output data calculating means sets the output data to "1" when the variable of logical AND is "1", sets the output data to "0", when the logical AND is "0" and does not change the output data under other conditions.

2. The digital filter according to claim 1, wherein the digital data are those of a plurality of digits, and the arithmetic logic means and the output data calculating means carries out said operations simultaneously for each digit.

3. A digital filter comprising:

an input;

at least one memory element coupled to the input for storing a common data table comprising new data received from the input and m cycles of previous data, an AND buffer table, an OR buffer table, an AND result table, and an OR result table; and a logical processing unit, the logical processing unit performing a logical AND on the data in the common data table and storing the result in the AND buffer table on a first periodic basis, performing a logical OR on the data in the common data table and storing the result in the OR buffer table on a second periodic basis, performing a logical AND on the data in the AND buffer table and storing the results in the AND result table, performing a logical OR on the data in the OR buffer table and storing the results in the OR buffer table, performing a logical OR on the AND result table and a previous decision data in the decision table to yield an intermediate result and subsequently performing a logical OR on the intermediate result and the OR result table to yield a decision result which is stored in the decision data table.

4. A digital filter comprising:

an input;

at least one memory element coupled to the input for storing a common data table comprising new data received from the input and m cycles of previous data, an AND result table, an OR result table, and a decision table; and a logical processing unit, the logical processing unit performing a logical AND on the data in the common data table and storing the AND result in the AND result table, the logical processing unit performing a logical OR on the data in the common data table and storing the OR result in the OR result table, the logical processing unit storing performing a logical OR on the AND result table and a previous decision data in the decision table to yield an intermediate result and subsequently performing a logical OR on the intermediate result and the OR result table to yield a decision result which is stored in the decision data table.

* * * * *